(12) United States Patent
Tateyama et al.

(10) Patent No.: US 7,278,199 B2
(45) Date of Patent: Oct. 9, 2007

(54) METHOD OF MAKING A THERMOELECTRIC DEVICE

(75) Inventors: Kazuki Tateyama, Yokohama (JP);
Takahiro Sogou, Yokohama (JP);
Tomohiro Iguchi, Kawasaki (JP);
Yasuhito Saito, Yokohama (JP);
Masayuki Arakawa, Yokohama (JP);
Naruhito Kondo, Kawasaki (JP);
Osamu Tsuneoka, Setagaya-ku (JP);
Akihiro Hara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/344,118

(22) Filed: Feb. 1, 2006

(65) Prior Publication Data

US 2006/0123799 A1   Jun. 15, 2006

Related U.S. Application Data

(63) Continuation of application No. 10/896,998, filed on Jul. 23, 2004, now Pat. No. 7,024,865.

(30) Foreign Application Priority Data

Jul. 25, 2003   (JP) ............................. 2003-202121
Mar. 25, 2004  (JP) ............................. 2004-090250

(51) Int. Cl.
*H01S 4/00*  (2006.01)

(52) U.S. Cl. .......................... 29/592.1; 29/832; 29/840

(58) Field of Classification Search ............... 29/592.1, 29/832, 840
See application file for complete search history.

(56) References Cited

U.S. PATENT DOCUMENTS

| | | | | |
|---|---|---|---|---|
| 3,223,406 A | * | 12/1965 | Traeger | 269/153 |
| 3,510,362 A | * | 5/1970 | Charland et al. | 136/202 |
| 4,420,364 A | | 12/1983 | Nukii et al. | |
| 5,737,923 A | * | 4/1998 | Gilley et al. | 62/3.7 |
| 5,956,569 A | | 9/1999 | Shiu et al. | |
| 6,226,994 B1 | | 5/2001 | Yamada et al. | |
| 6,292,365 B1 | | 9/2001 | Ashiwake et al. | |
| 6,347,521 B1 | * | 2/2002 | Kadotani et al. | 62/3.7 |
| 6,425,440 B1 | | 7/2002 | Tsenter et al. | |
| 6,508,062 B2 | | 1/2003 | Flanigan | |

FOREIGN PATENT DOCUMENTS

| | | |
|---|---|---|
| JP | 2000-252528 | 9/2000 |
| JP | 3165129 | 3/2001 |

* cited by examiner

*Primary Examiner*—Carl J. Arbes
(74) *Attorney, Agent, or Firm*—Oblon; Spivak; McClelland, Maier & Neustadt, P.C.

(57) ABSTRACT

In order to provide a highly reliable thermoelectric device, in a thermoelectric device, a plurality of heat-radiating-side electrodes, arranged in accordance with positions where respective thermoelectric elements are to be arranged, are arrayed in an array fashion on a planer surface of a heat-radiating-side board. Heat-radiating-side end surfaces of the plurality of p-type thermoelectric elements and n-type thermoelectric elements and the heat-radiating-side electrodes are joined together by solders. Heat-absorbing-side electrodes are brought into sliding contact with heat-absorbing-side end surfaces of these thermoelectric elements.

9 Claims, 4 Drawing Sheets

METHOD OF MAKING A THERMOELECTRIC DEVICE

CROSS-REFERENCE TO RELATED APPLICATIONS

This application is a continuation of U.S. patent application Ser. No. 10/896,998, filed Jul. 23, 2004, now U.S. Pat. No. 7,024,865, and in turn claims the benefit of priority from Japanese Patent Application No. 2003-202121 filed on Jul. 25, 2003 and Japanese Patent Application No. 2004-90250 filed on Mar. 25, 2004; the entire contents of each of which are incorporated herein by reference.

BACKGROUND OF THE INVENTION

1. Field of the Invention

The present invention relates to a thermoelectric device configured in a manner that heat-absorbing-side electrodes are attached onto heat-absorbing surfaces of a plurality of thermoelectric elements, heat-radiating-side electrodes are attached onto heat-radiating surfaces of the respective thermoelectric elements, and all of the thermoelectric elements are connected electrically in series and thermally in parallel. Particularly, the present invention relates to a thermoelectric device having good manufacturability and excellent joint reliability.

2. Description of the Related Art

A thermoelectric device is composed by combining thermoelectric elements utilizing thermoelectric effects such as the Thomson effect, the Peltier effect and the Seebeck effect, and has already been in high-volume production as a temperature regulation unit which converts electricity into heat. Moreover, also as a generator, researches and developments of the thermoelectric device have been progressed.

In a thermoelectric device as the generator, a plurality of thermoelectric elements are arrayed in a state of being sandwiched between insulating boards having electrodes, and are connected electrically in series and thermally in parallel.

In order to make power generation efficiency of the thermoelectric device approximate to power generation efficiency of the thermoelectric elements themselves, it is necessary that heat supply to one ends of the thermoelectric elements and heat radiation from the other ends of the thermoelectric elements be performed smoothly. For this reason, for the boards constituting the thermoelectric device, ceramic boards excellent in thermal conductivity are used. Furthermore, the electrodes arranged on the ends of the thermoelectric elements are composed of a material having low electric resistance.

The thermoelectric device operates by being heated, and during the operation, the respective constituent members are thermally expanded as compared with those at normal temperature. In this case, due to a difference in coefficient of linear expansion between the respective constituent members and a temperature difference between the heat-absorbing side and the heat-radiating side, deformation amounts of the respective members differ from one another. Because of such a difference in thermal deformation, in some cases, joint parts of the thermoelectric elements and the thermoelectric elements themselves have become prone to be damaged.

SUMMARY OF THE INVENTION

It is an object of the present invention to provide a thermoelectric device excellent in reliability, in which joint parts of thermoelectric elements and the thermoelectric elements themselves are difficult to be damaged even if the joint parts and the thermoelectric elements are thermally deformed by being heated, and to provide a manufacturing method thereof.

The thermoelectric device of the present invention is characterized by including a wiring board, a plurality of thermoelectric elements of which one end surfaces are arranged on the wiring board, a plurality of electrode members arranged to contact other end surfaces of the plurality of thermoelectric elements, a lid which holds the plurality of thermoelectric elements and the plurality of electrode members, the lid being arranged so that pressure is applied in a direction from the one end surfaces of the thermoelectric elements to the other end surfaces thereof, and a coupling member which maintains a relative position of the wiring board and the lid.

Here, it is preferable that the electrode members have protruding portions which regulate positions of the thermoelectric elements, the protruding portions being provided to surround regions against which the thermoelectric elements are contacted.

Moreover, it is preferable that the electrode members be arranged to connect the thermoelectric elements electrically in series.

Furthermore, it is preferable that deformable structure members made of a conductive material be arranged between the thermoelectric elements and the electrode members.

Still further, it is preferable that insulating members which regulate positions of the thermoelectric elements be arranged between the thermoelectric elements arranged separately.

Moreover, it is desirable that an interval between the thermoelectric elements surrounded by each of the electrode members be shorter than an interval between the thermoelectric elements concerned and the thermoelectric elements surrounded by the electrode member adjacent to the electrode member concerned.

Furthermore, it is desirable that the coupling member be one to be joined to the wiring board by a brazing material, and that a joint surface of the coupling member to the brazing material be formed into a chamfer shape.

Still further, it is desirable that a bent folded to outside be provided on a contact portion of the coupling member with the lid.

Yet further, it is desirable to provide a bent portion bent in a direction where pressure is applied to the lid.

DESCRIPTION OF THE EMBODIMENT

Embodiments of the present invention will be described below in detail with reference to the drawings.

Figure 1:
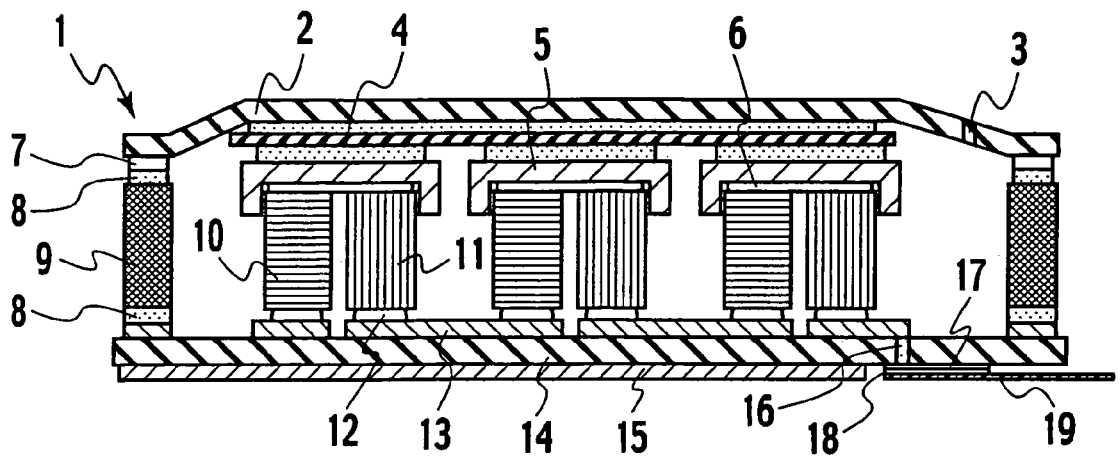
FIG. 1 is a cross-sectional view showing a configuration of a thermoelectric device of a first embodiment.

FIG. 1 shows a cross-sectional structure of a thermoelectric device of a first embodiment. The thermoelectric device 1 includes a plurality of p-type thermoelectric elements 10 and n-type thermoelectric elements 11, one end surfaces of which are arranged on a heat-radiating-side board 14 serving as a wiring board. A plurality of heat-radiating-side electrodes 13, arrayed in accordance with positions where the respective thermoelectric elements 10 and 11 are to be arranged, are arrayed in an array fashion on a planer surface of the heat-radiating-side board 14. With regard to the p-type thermoelectric elements 10 and the n-type thermoelectric elements 11, the heat-radiating-side end surfaces of these thermoelectric elements and the heat-radiating-side electrodes 13 are joined to each other by solders 12.

On heat-absorbing-side end surfaces as the other end surfaces of the respective thermoelectric elements 10 and 11, a heat-absorbing-side insulating board 4, heat-absorbing-side electrodes 5 as electrode members, and metal fiber nets 6 as net-structure members are arranged. The metal fiber nets 6 are structural members made of a conductive material and elastically deformable in the thickness direction. The heat-absorbing-side end surfaces of the thermoelectric elements are brought into contact with the metal fiber nets 6 in a state where pressure is applied thereto. With such a configuration, variations of heights of the thermoelectric elements are absorbed by the metal fiber nets 6, thus making it possible to obtain stable conduction. Each of these metal fiber nets 6 is arranged so as to straddle the heat-absorbing-side end surfaces of a pair of the thermoelectric elements 10 and 11.

On the heat-absorbing-side end surfaces of each pair of the thermoelectric elements 10 and 11, the heat-absorbing-side electrode 5 is disposed with the metal fiber net 6 interposed therebetween. This heat-absorbing-side electrode 5 is provided so as to surround the contacted surfaces of the thermoelectric elements 10 and 11, and includes a protruding portion which regulates positions of the thermoelectric elements. In this embodiment, each heat-absorbing-side electrode 5 forms a box-type structure in a bath tab shape so as to cover the metal fiber net 6. The heat-absorbing-side electrode 5 is formed into the bath tab shape, and thus the protruding portion makes it difficult for the metal fiber net and the thermoelectric elements to come away from the thermoelectric device, and planer bottom portions of the thermoelectric elements are opposed to the heat-radiating-side insulating board. Accordingly, it is made possible to increase a contact surface of the bottom portions and the insulating substrate as compared with the case of only a contact using a net structure, contributing to an increase of heat absorption efficiency.

Moreover, as compared with the case of only a metal fiber nets, the above-described structure contributes to a lowering of resistance of the electrode members. On the heat-absorbing-side insulating board 4, copper layers are provided individually for regions abutting on the heat-absorbing-side electrodes 5. Moreover, on a main surface opposite with a main surface abutting on the heat-absorbing-side electrodes 5, a copper layer is provided entirely, and thus the heat absorption efficiency is enhanced, and a warp of the heat-absorbing-side board 4 is prevented. This has an effect in that the warp does not come to occur in the heat-absorbing-side board 4 when the entire thermoelectric device is thrown in a furnace for the purpose of brazing a frame 9 to the heat-radiating-side board 14.

The heat-absorbing-side insulating board 4, the heat-absorbing-side electrodes 5 and the metal fiber nets 6 as the net structural members are held so as to be pressurized in a direction from the one end surfaces of the thermoelectric elements to the other end surfaces of the same by a lid 2 and the heat-radiating-side board 14, that is, so as to be pressurized in a direction where a current flows accompanied with a generation of electromotive power. Specifically, the lid 2 and the heat-radiating-side board 14 are arranged in a fashion to be spaced/opposed from/to each other with the thermoelectric elements 10 and 11 sandwiched therebetween. As a coupling member, the frame 9 maintains a relative position of the heat-radiating-side board 14 and the lid 2. The thermoelectric device 1 forms a box-shape structure hermetically sealed by the lid 2, the frame 9 and the heat-radiating-side board 14. The inside of the box-type structure is set at a reduced-pressure atmosphere so as not to cause deformation and breakage of the structure even if a large temperature change is applied thereto. In order to maintain this atmosphere, the respective thermoelectric elements 10 and 11 are hermetically sealed by the box-type structure.

The electromotive power generated in the thermoelectric elements 10 and 11 is taken outside from a through hole 16 formed through the heat-radiating-side board 14. To a portion of the through hole 16, which is exposed to an outer main surface of the heat-radiating-side board 14, outer lead 18 wired on an insulating board by a solder 17 is connected. Moreover, on the outer surface of the heat-radiating-side board 14, a metal film 15 for improving heat radiation characteristics is formed.

In this embodiment, operation temperature of a high-temperature side of the thermoelectric device is set at 600° C., and accordingly, for the thermoelectric elements, p-type and n-type thermoelectric elements having a skutterudite structure are used. The p-type and n-type elements indicate those composed in such a relation in which the respective directions of generating currents when the elements are heated are reverse to each other with respect to a direction of a heat gradient. The p-type and n-type thermoelectric elements 10 and 11 are connected in series by the heat-radiating-side electrodes 13 and the heat-absorbing-side electrodes 5, and thus voltage of the electromotive power is raised. Specifically, the current passes alternately through the p-type thermoelectric elements 10 and the n-type thermoelectric elements 11, and is taken from the outer lead 18.

Figure 2:
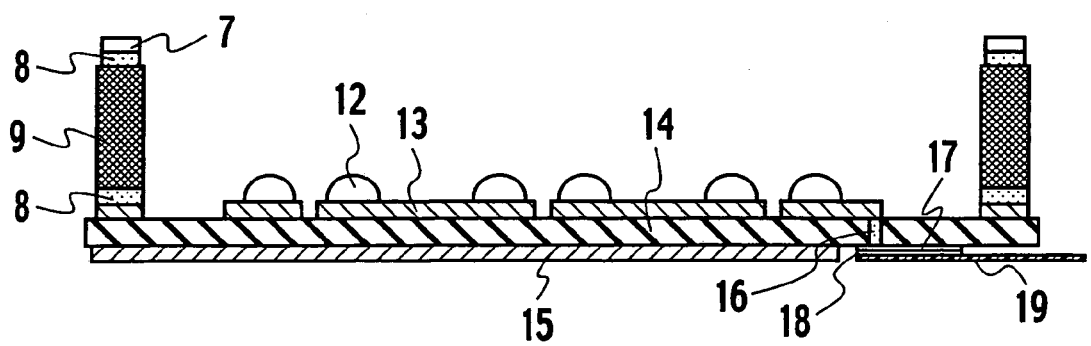
FIG. 2 is a view showing a first manufacturing step of the thermoelectric device.

The thermoelectric device of this embodiment is manufactured, for example, through steps as follows. As shown in FIG. 2, to portions to be jointed to the thermoelectric elements in the heat-radiating-side electrodes 13 formed on the planer main surface of the heat-radiating-side board 14, the solders 12 are supplied by a dispenser. In this embodiment, copper is used for the heat-radiating-side electrodes 13, a ceramic board having a base material of $Al_2O_3$ is used for the heat-radiating-side board 14, and solder paste of Pb-8 wt % Sn-2 wt % Ag is used with regard to a composition of the solders 12. Note that, in this embodiment, as joint members replacing the solder material of the solders 12, any is usable as long as a effect of the present invention is obtained, and no particular limitations are imposed thereon.

For the frame 9, a ceramic board having an $Al_2O_3$ base material is used, and the frame 9 and the heat-radiating-side board 14 are joined together by use of a brazing material 8. For the brazing material, silver brazing is used. Moreover, on an upper surface of the frame 9, Kovar 7 as a material equivalent to a material of the lid 2 is further brazed onto the brazing material 8 for the purpose of welding to be described later.

Note that, though the base materials of the frame 9 and the heat-radiating-side board 14 are selected in consideration of a balance between heat radiation efficiency, heat insulation performance and airtight performance, any is usable as long as it does not significantly lower power generation performance of the thermoelectric device in general. Moreover, it is satisfactory if the brazing material 8 is one difficult to lower joint strength at a predetermined operation temperature of the thermoelectric device and capable of maintaining a joint state of the ceramics and the ceramics, and no particular limitations are imposed thereon. Furthermore, it is needless to say that, the structure in which the frame 9 and the heat-radiating-side board 14 are brazed together may not be adopted, but these can be constructed as a box-type structure in a bath tab shape.

On the heat-radiating-side end surfaces of the thermoelectric elements 10 and 11, Cu thin films are formed in order to improve joint characteristics of the solders 12 and the thermoelectric elements 10 and 11. Film thickness of the thin films is set at approximately 20 μm in total in a manner that a film of 2 μm is deposited by Cu sputtering and a film of 18 μm is then deposited by electroplating. Note that it is preferable to change the joint material in accordance with the operation temperature. Moreover, it is satisfactory if a treatment for the end surfaces of the thermoelectric elements is one difficult to damage performance of the thermoelectric elements and capable of improving the connection characteristics of the thermoelectric elements to the joint material, and no particular limitations are imposed thereon.

Figure 3:
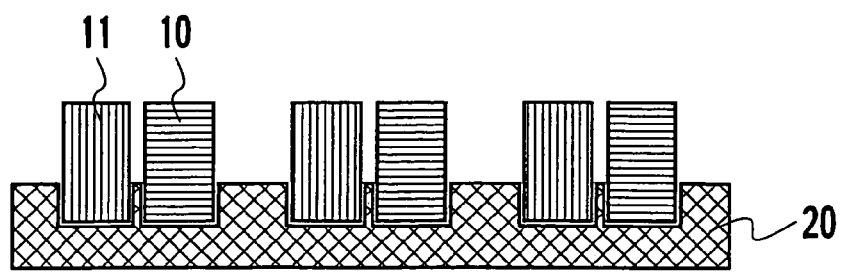
FIG. 3 is a view showing a second manufacturing step of the thermoelectric device.
Figure 4:
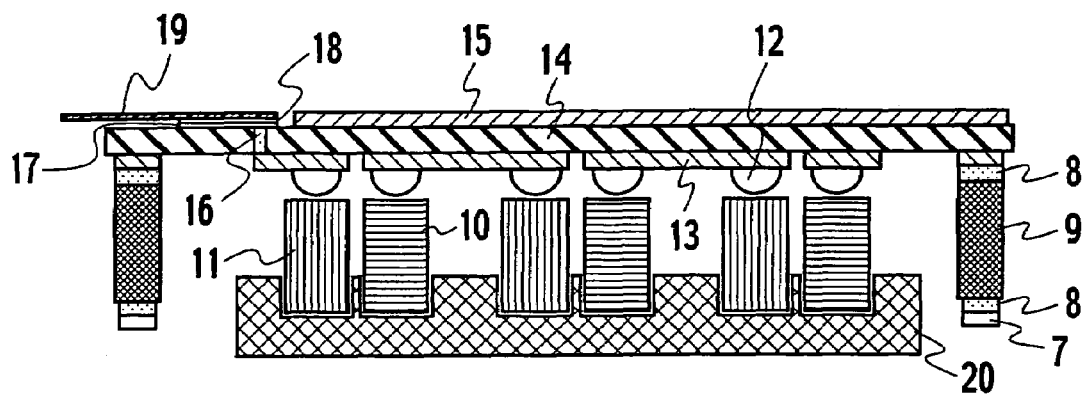
FIG. 4 is a view showing a third manufacturing step of the thermoelectric device.

As shown in FIG. 3, on an assembly jig 20 having structures, each of which is regulated for a relative position in which the end surface of each of the thermoelectric elements 10 and 11 is to be present, the respective thermoelectric elements 10 and 11 are arranged so that the heat-absorbing-side end surface of each thereof contacts each of such regulation structures. Thus, the relative positions of the thermoelectric elements 10 and 11 are mutually determined. Then, the heat-radiating-side board 14 shown in FIG. 2, to which the solders are supplied, is inverted, covers the heat-radiating-side end surfaces of the respective thermoelectric elements 10 and 11 on the assembly jig 20, and a state shown in FIG. 4 is made. Specifically, the heat-radiating-side electrodes 13 are mounted on the heat-radiating-side end surfaces of the respective thermoelectric elements 10 and 11 with the solders 12 interposed therebetween.

In this case, variations of heights of the thermoelectric elements are absorbed in the joint parts by the solders 12, the heat-absorbing-side end surfaces of the thermoelectric elements 10 and 11 are aligned by the assembly jig 20, and planarity of a virtual plane formed of the plurality of heat-absorbing-side end surfaces serving as joint surfaces is improved, thus making it possible to easily realize a slidingly-contact of the heat-absorbing-side electrodes 5 and the lid 2.

Figure 5:
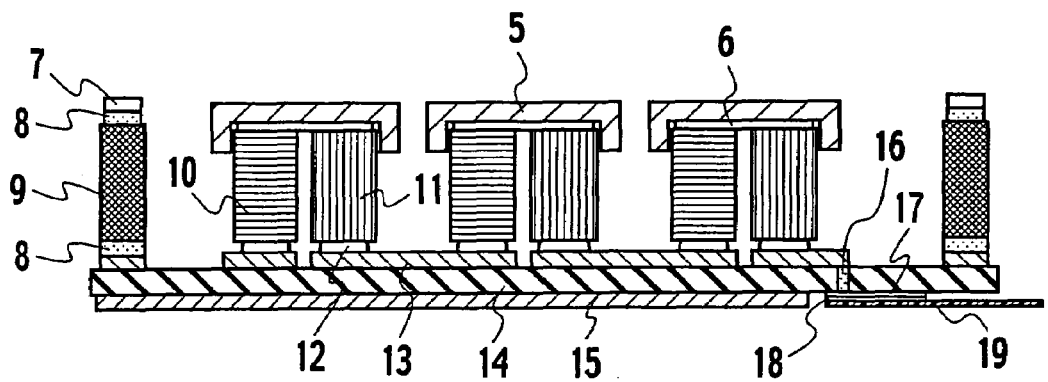
FIG. 5 is a view showing a fourth manufacturing step of the thermoelectric device.
Figure 6:
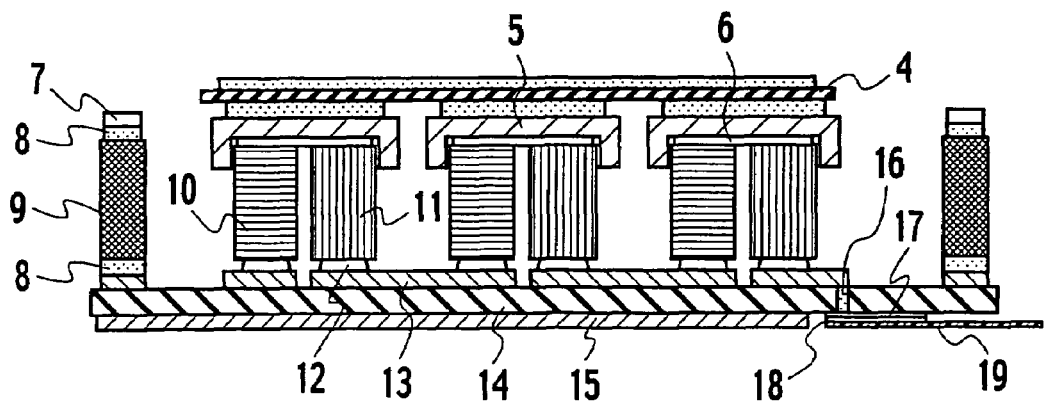
FIG. 6 is a view showing a fifth manufacturing step of the thermoelectric device.

Subsequently, as shown in FIG. 5, the metal fiber nets 6 and the heat-absorbing-side electrodes 5, which connect the p-type thermoelectric elements 10 and the n-type thermoelectric elements 11 to each other, are arranged on the respective thermoelectric elements 10 and 11 so as to connect the p-type thermoelectric elements 10 and the n-type thermoelectric elements 11 electrically in series. Furthermore, as shown in FIG. 6, the heat-absorbing-side insulating board 4 is disposed so as to cover these metal fiber nets 6 and the heat-absorbing-side electrodes 5.

Subsequently, the lid 2 in which a sealing hole 3 as an opening making a front and back of the lid 2 communicate with each other is disposed so as to cover the heat-absorbing-side insulating board 4, and the lid 2 and the frame 9 are welded by the Kovar 7 previously brazed in a frame shape. In this embodiment, for the material of the lid 2, the Kovar is used in order to reduce a difference in thermal expansion between the frame 9 and the heat-radiating-side board 14 while obtaining predetermined heat absorbing performance.

Finally, the thermoelectric device is left in the reduced-pressure atmosphere, and the sealing hole 3 is closed by laser fusing, thus making it possible to obtain the thermoelectric device having a hermetically sealed structure.

Furthermore, the lead taken out from the device is performed through the through hole 16 provided in the heat-radiating-side board 14, thus making it possible to improve hermetic sealing characteristics of the device.

Figure 7:
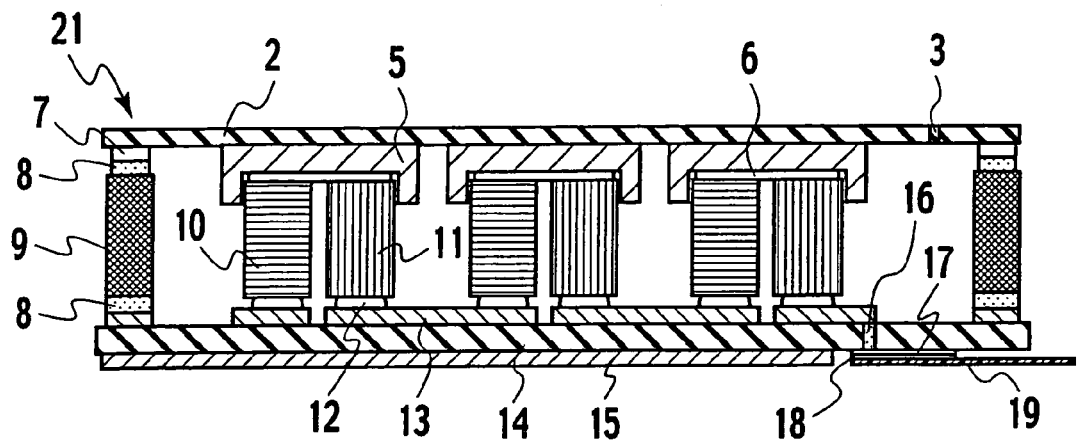
FIG. 7 is a cross-sectional view showing a configuration of a thermoelectric device of a second embodiment.

FIG. 7 shows a cross-sectional structure of a thermoelectric device of a second embodiment. This thermoelectric device 21 is characterized in that the lid 2 and the heat-absorbing-side electrodes 5 are brought into direct contact with each other without separately preparing the insulating board.

It is necessary for the lid 2 to be joined to the frame 9 by welding in a similar way to the first embodiment, and accordingly, the lid 2 is made of metal. In this case, it is necessary that each of the heat-absorbing-side electrodes 5 be electrically independent of the others, and accordingly, it is necessary to electrically insulate the lid 2 and the heat-absorbing-side electrodes 5 from each other. In this connection, insulating films such as oxide films are formed on contact surfaces of the lid 2 with the heat-absorbing-side electrodes 5. Besides this, it is possible to constitute the thermoelectric device by depositing the insulating films on contact surfaces of the heat-absorbing-side electrodes 5 with the lid 2, or by depositing the insulating films on both of the lid 2 and the heat-absorbing-side electrodes 5.

In this thermoelectric device, the heat-absorbing-side insulating board 4 can be omitted as compared with the embodiment shown in FIG. 1. Accordingly, this thermoelectric device has low thermal resistance, and can make temperature of the heat-absorbing-side end surfaces of the thermoelectric elements approximate to temperature of an object from which the heat is to be absorbed, thus making it possible to improve power generation efficiency of the thermoelectric device.

Figure 8:
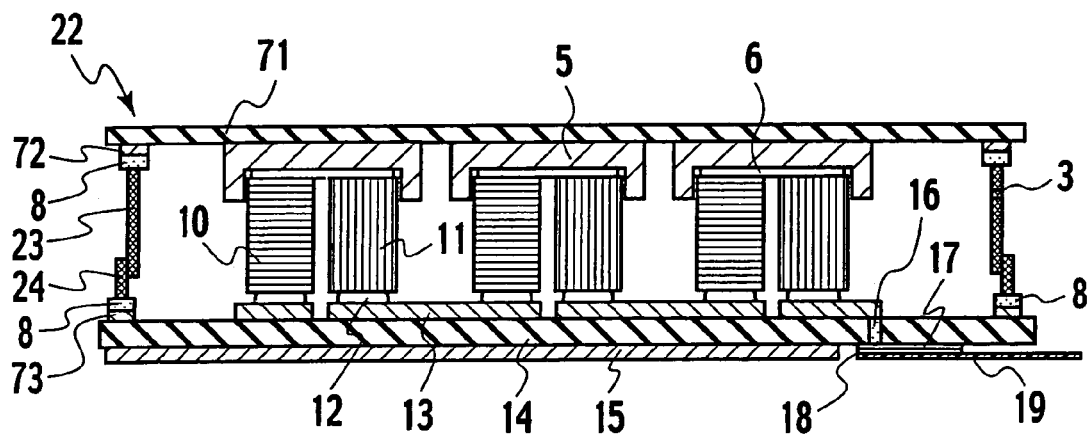
FIG. 8 is a cross-sectional view showing a configuration of a thermoelectric device of a third embodiment.

FIG. 8 shows a cross-sectional structure of a thermoelectric device of a third embodiment. This thermoelectric device 22 is characterized in that a frame connecting a lid 71 and the heat-radiating-side board 14 to each other is composed of a frame 23 and a frame 24, which are obtained by dividing the frame into two in the height direction. The lid 71 and the heat-radiating-side board 14 are composed of ceramics such as $Al_2O_3$, and the frame 23 and the frame 24 are composed of, for example, Kovar in order to be welded.

The lid 71 having a metal portion 72 to which the frame 23 is brazed with silver brazing 8 interposed therebetween and the heat-radiating-side board 14 having a metal portion 73 to which the frame 24 is brazed with the silver brazing 8 interposed therebetween are fitted to each other on abutting surfaces of the frame 23 and the frame 24. Then, a portion where the frame 23 and the frame 24 overlap with each other is welded by laser. Furthermore, the sealing hole 3 is closed by laser fusing under a reduced-pressure atmosphere, thus making it possible to realize a hermetically sealed structure. The metal portion 72 and the metal portion 73 are formed of, for example, Copper and the like.

In this embodiment, the structure in which the frame 23 and the frame 24 are fitted to each other is adopted. Accordingly, when fabricating the thermoelectric device, it is made possible to absorb the variations of the heights of the elements, assembly variations of solder joints, and the like by means of a manner of this fitting, thus making it possible to easily realize the hermetically sealed structure.

Figure 9:
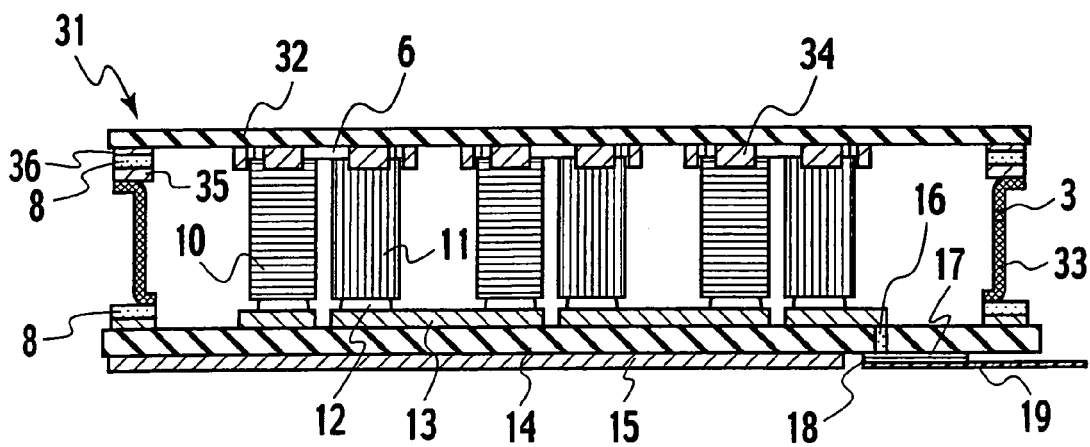
FIG. 9 is a cross-sectional view showing a configuration of a thermoelectric device of a fourth embodiment.

FIG. 9 shows a cross-sectional structure of a thermoelectric device of a fourth embodiment. This thermoelectric device 31 is characterized in that a frame connecting a lid 32 and the heat-radiating-side board 14 to each other is composed of a frame 33 bent at both end portions in the height direction, that is, at joint parts thereof to the lid 32 and the heat-radiating-side board 14. The lid 32 and the heat-radiating-side board 14 are composed of ceramics such as $Al_2O_3$, and the frame 33 is composed of weldable metal, for example, Kovar.

For joining one end portion of the frame 33 and the heat-radiating-side board 14, brazing is performed by interposing the brazing material 8 therebetween. On a bent of the bent frame 33, a solder fillet shape is formed, contributing to an improvement of joint strength between the frame 33 and the heat-radiating-side board 14.

Meanwhile, joining of a bent of the other end portion of the frame 33 and the lid 32 is performed by welding. For the lid 32, a Kovar ring 35 is brazed to a metal portion 36 formed of Copper or the like with the brazing material 8 interposed therebetween, and this Kovar ring 35 and the frame 33 is welded together. In this case, an end surface of the other end portion is formed so as to be directed to the outside of the thermoelectric device 31. This bending processing makes it possible to increase a contact area of the frame 33 and the lid 32. A laser beam is irradiated on a joint interface of the frame 33 and the Kovar previously heaped on the lid 32, thus performing the welding.

In such a way, the joint end surfaces of the metal-made frame are previously bent, and thus it becomes easy to improve the joint strengths both in the welding and in the brazing. As a result of this, this bending contributes to thinning thickness of the frame.

In the thermoelectric device 31 of FIG. 9, a structure of heat-absorbing-side electrodes also differs. Between main surfaces of the lid 32, on a main surface facing the inside of the thermoelectric device, metal protruding portions 34 are erected so as to surround regions to which the heat-absorbing-side end surfaces of the thermoelectric elements 10 and 11 are opposite. It is desirable that the protruding portions 34 be formed of a good conductor such as Copper. The metal fiber nets 6 are arranged on the regions surrounded by these protruding portions, and the heat-absorbing-side end surfaces of the thermoelectric elements 10 and 11 are arranged so as to be thrust against these metal fiber nets 6. In such a way, shifts of the metal fiber nets 6 and the thermoelectric elements 10 and 11 are restricted by the protruding portions 34, thus making it possible to reduce contact failures.

Figure 10:
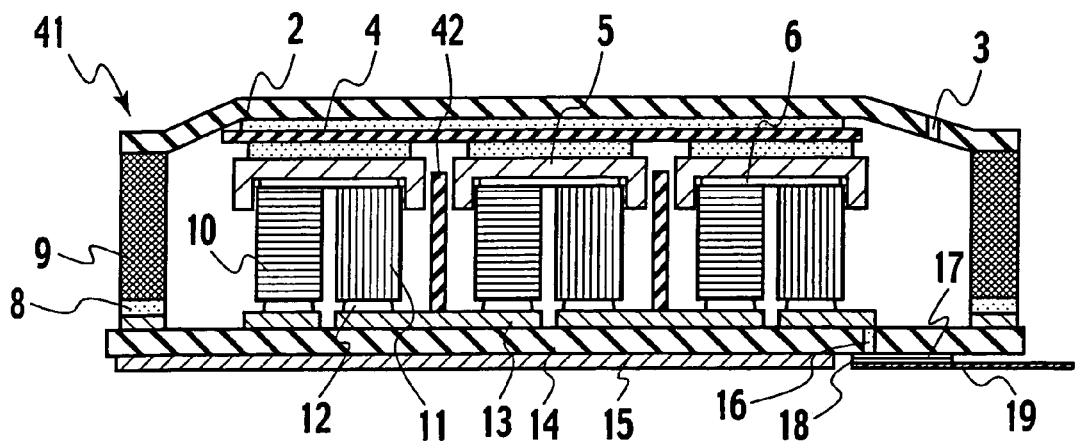
FIG. 10 is a cross-sectional view showing a configuration of a thermoelectric device of a fifth embodiment.

FIG. 10 shows a cross-sectional structure of a thermoelectric device of a fifth embodiment. In this thermoelectric device 41, ceramic plates 42 as insulating members are erected in an inner space of a box-type structure. Each of the ceramic plates 42 is placed so as to be present between the thermoelectric elements 10 and 11 on the heat-radiating-side electrode 13 electrically connecting the thermoelectric elements 10 and 11 to each other. A height of the ceramic plates is set at a height to an extent reaching the heat-absorbing-side electrodes 5 but not reaching the lid or the heat-absorbing-side insulating board.

Figure 11:
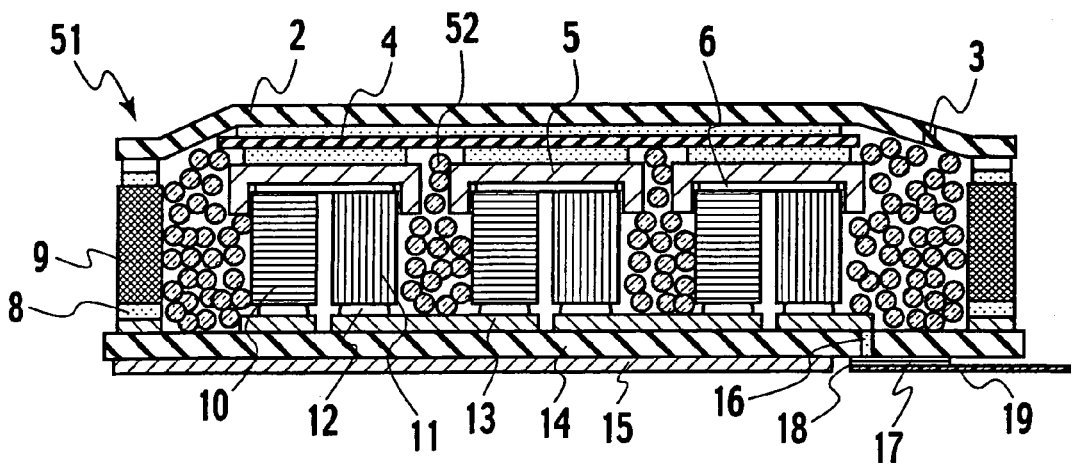
FIG. 11 is a cross-sectional view showing a configuration of a thermoelectric device of a sixth embodiment.

FIG. 11 shows a cross-sectional structure of a thermoelectric device of a sixth embodiment. This thermoelectric device 51 uses a plurality of glass balls 52 as insulating members, which have a particle size distribution ranging from 0.18 mm to 0.22 mm, instead of the ceramic plates 42. The glass balls are filled in so as to fill an inner space of a box-type structure. It is preferable to eliminate gas present in gaps caused by the mutual glass balls to the maximum as possible and to set the inner space at a reduced-pressure atmosphere. The use of the glass balls 52 makes it possible to omit the step of individually arranging the insulating members, thus facilitating the manufacturing of the thermoelectric device.

Figure 12:
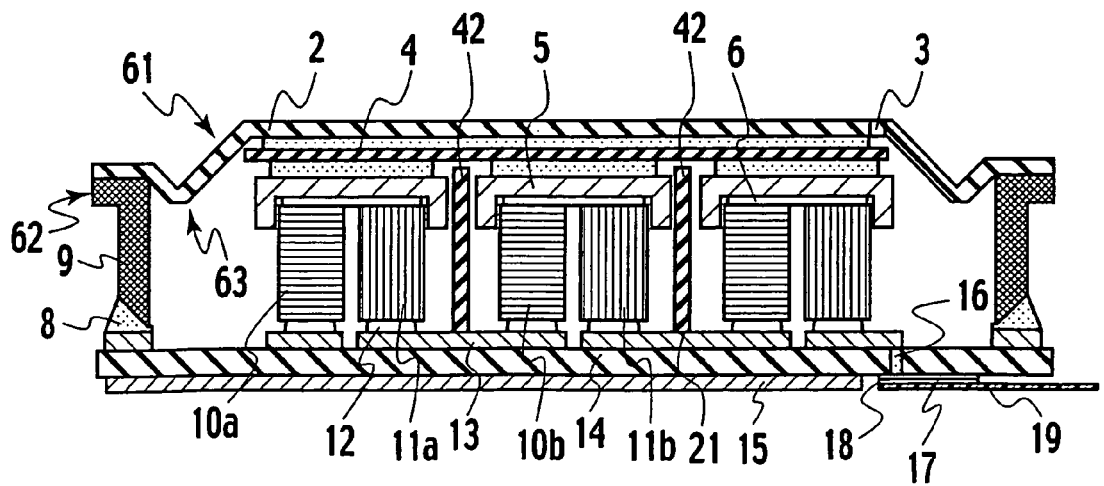
FIG. 12 is a cross-sectional view showing a configuration of a thermoelectric device of a seventh embodiment.

FIG. 12 shows a cross-sectional structure of a thermoelectric device of a seventh embodiment. This thermoelectric device 61 has a configuration in which an interval between the thermoelectric elements surrounded by each of the heat-absorbing-side electrodes 5 is made shorter than an interval between the thermoelectric elements concerned and the thermoelectric elements surrounded by the heat-absorbing-side electrode adjacent to the heat-absorbing-side electrode 5 concerned. Specifically, an interval between a p-type thermoelectric element 10b and an n-type thermoelectric element 11b electrically connected to each other by the heat-absorbing-side electrode 5 is made shorter than an interval between the p-type thermoelectric element 10b and an n-type thermoelectric element 11a electrically connected to each other by the heat-radiating-side electrode 13. With this configuration, insulating characteristics between the adjacent heat-absorbing-side electrodes 5 are ensured, and a packaging density of the thermoelectric elements is improved, thus improving power generation performance per unit area. A desirable material of the frame 9 is one having a small thermal conductivity for the purpose of reducing a quantity of heat flown to the frame 9 and increasing a quantity of heat flown to the respective thermoelectric elements. Here, for facilitating the welding of the frame 9 to the lid 2, Kovar, the same material as that of the lid 2, is used.

As shown in FIG. 12, a joint surface of the frame 9 to the brazing material 8 is formed into a chamfer shape as a triangular shape in cross section, and a fillet corresponding to the chamfer shape is formed on the brazing material 8, thus improving joint strength thereof. The reason that such shapes are adopted for the frame 9 and the brazing material 8 when improving the joint strength is because, if the frame 9 and the brazing material 8 are made thick in a horizontal direction of FIG. 12, heat becomes easy to conduct for this amount, causing an upsizing of the device itself. Note that no particular limitations are imposed on the material of the brazing material 8 as long as the material does not lower the joint characteristics at the operation temperature of the thermoelectric device.

Moreover, in the frame 9, a bent 62 folded to the outside is provided on a contact portion of the frame 9 with the lid 2, and an area of a contact surface of the frame 9 with the lid 2 is enlarged, thus facilitating the frame 9 and the lid 2 to be welded together. Furthermore, the bent 62 of the frame 9 and the end portion of the lid 2 are welded together from the outside by laser, thus facilitating a visual inspection for such a welded state, and thus ensuring hermetic sealing characteristics. Note that, though the frame 9 can be fabricated by mechanical shaving, no particular limitations are imposed on a machining method as long as the method can machine a similar shape to the above-described one.

Moreover, in the lid 2, a bent 63 bent in a direction where pressure is applied to the inside of the joint portion of the lid 2 to the frame 9 is provided to impart elasticity to the lid 2, thus facilitating assembly when the lid 2 is welded to the frame 9 while being thrust against the heat-absorbing-side board 4.

Copper is used for the electrodes, a ceramic board having a base material of $Si_3N_4$ is used for the heat-radiating-side board 14, and solder paste of Pb-8 Sn-2 Ag is used for the solder material. Note that no particular limitations are imposed on the material of the solder as long as an effect of the present invention is obtained.

The outer lead 18 taken out from the thermoelectric device through the through hole 16 is coated with insulating resin 19. The through hole 16 is utilized for drawing the wiring, thus facilitating the hermetic sealing characteristics of the thermoelectric device to be ensured. Moreover, heights at which the respective outer surfaces of metal foil 15 and the insulating resin 19 are located are matched with each other, thus reducing thermal contact resistance when the thermoelectric device is brought into contact with a heat source such as a heat sink.

As described above, in the thermoelectric device of this embodiment, the heat-absorbing-side electrodes attached onto heat-absorbing surfaces of the plurality of p-type and n-type thermoelectric elements are formed into a holding structure capable of slidingly contacting the lid while being thrust thereagainst. Thus, even if the lid and the thermoelectric elements are thermally expanded at rates different from each other, damages to the joint parts and the thermoelectric element can be prevented, and as compared with the conventional thermoelectric device, a thermoelectric device having excellent reliability can be provided.

Moreover, the metal fibers having the net structure are used for the heat-absorbing-side electrodes, thus making it possible to absorb the variations of the heights of the elements when assembling the thermoelectric device. Therefore, the joint characteristics are improved, and the thermoelectric device having high reliability can be provided.

Furthermore, the thermoelectric device is formed into the hermetically sealed structure, thus making it possible to prevent deterioration due to oxidation of the thermoelectric elements and the joint parts, and to provide the thermoelectric device having high reliability.

The heat-absorbing-side insulating board 4, the heat-absorbing-side electrodes 5 and the metal fiber nets 6 are sandwiched between the lid 2 and the heat-radiating-side board 14. Thus, even if the thermoelectric device is heated and thermally deformed, slips occur on the contact surfaces of the respective thermoelectric elements 10 and 11 and the heat-absorbing-side electrodes 5, thus making it possible to prevent the breakage and the like of the elements from occurring.

The convex portions contacting the side surfaces of the thermoelectric elements during the assembly and the thermal deformation are provided on the peripheral edges of the heat-absorbing-side electrodes 5, thus making it possible to prevent the heat-absorbing-side electrodes 5 from being detached from the heat-absorbing-side end surfaces of the thermoelectric elements.

The metal fiber nets 6 absorb the height variations of the thermoelectric elements and assembly variations when the thermoelectric elements are joined to the heat-radiating side board by the solders 12 by means of a deformation function of the net structure, thus making it possible to apply pressing load to all the thermoelectric elements. Moreover, the heat-absorbing-side electrodes 5 in which the convex portions are provided on the peripheral edges and the metal fiber nets 6 are combined, thus making it possible to prevent the metal fiber nets 6 from dropping off. Moreover, assembly characteristics of the thermoelectric device are improved. The heat-absorbing-side electrodes 5 may be formed into a net structure.

While it is necessary that the heat-absorbing-side electrodes 5 be electrically independent of one another, it is necessary to weld the lid 2 and the frame 9 in order to realize the hermetically sealed structure, and it is desirable that the lid 2 be made of metal from a viewpoint of workability. For this reason, the heat-absorbing-side insulating board 4 is provided between the lid 2 and the heat-absorbing-side electrodes 5, and thus insulation therebetween can be securely made. Moreover, the ceramic plates 42 are arranged between the respective pairs of thermoelectric elements 10 and 11, thus making it possible to improve the insulating characteristics therebetween. Here, pieces of metal film are provided on both surfaces of the heat-absorbing-side insulating board, and thus it can be expected that thermal paths from the lid 2 to the respective thermoelectric elements 10 and 11 are formed and that variations thereof in the thickness direction when assembling the thermoelectric device are absorbed. Moreover, insulating thin films are formed on the contact surfaces of the lid 2 with the heat-absorbing-side electrodes 5 and on the contact surfaces of heat-absorbing-side electrodes 5 with the lid 2, thus making it possible to omit the heat-absorbing-side insulating board 4. Thus, the structure can be simplified, the temperature difference between the object from which heat is to be absorbed and the heat-absorbing-side end surfaces of the thermoelectric elements can be reduced in terms of heat, and the power generation efficiency can be improved as a thermoelectric device.

The insulating members regulating the positions of the thermoelectric elements are arranged between the adjacent thermoelectric elements. Thus, even if a large shift due to an unexpected impact is applied to the thermoelectric elements, the adjacent thermoelectric elements can be prevented from contacting each other, and it is made possible to prevent the thermoelectric elements from being separated from the heat-absorbing-side electrodes with which the thermoelectric elements are brought into sliding contact. These insulating members may be either liquid or solid. However, when the inner space of the device is filled with some substance, it is apprehended that, due to thermal expansion of this substance, a breakage and a conduction failure may occur in the welded portions. Accordingly, it is preferable that a structure be adopted, in which powder or a substance composed of a plurality of particles is filled. It is preferable that the powder or the substance have a composition not to cause autohesion in a range of the operation temperature of the thermoelectric device. Moreover, when the insulating members are formed into a wall structure, it is preferable to constitute the insulating members so as to be joined to only any one of the members constituting the box-structure or to only one continuous plane of the box-type structure composed by coupling a plurality of planes discontinuously to one another.

This thermoelectric device sets the operation temperature of the high-temperature side at 600° C., and accordingly, for the thermoelectric elements, the p-type and n-type thermoelectric elements having the skutterudite structure are used. Such thermoelectric elements of the skutterudite are oxidized at the atmosphere of 600° C., and the performance thereof is lowered. In this connection, the hermetically sealed structure composed of the lid 2, the frame 9 and the heat-radiating-side board 14 is adopted. Thus, it is made possible to realize the reduced-pressure atmosphere, it is made possible to prevent the oxidation of the respective thermoelectric elements 10 and 11, and the thermoelectric device 1 can be installed at any position.

The interval between the thermoelectric elements surrounded by the heat-absorbing-side electrodes 5 is made shorter than the interval between the thermoelectric elements concerned and the thermoelectric elements surrounded by the heat-absorbing-side electrode adjacent to the heat-absorbing-side electrode 5 concerned. Thus, the insulating characteristics between the adjacent heat-absorbing-side electrodes 5 can be ensured, and the installation density of the thermoelectric elements is improved, thus making it possible to improve the power generation performance per unit area.

The joint surface of the frame 9 to the brazing material 8 is formed into the chamfer shape, thus making it possible to improve the joint strength of the frame 9 and the brazing material 8.

On the contact portion of the frame 9 with the lid 2, the bent folded to the outside is provided, and thus the area of the contact surface of the frame 9 with the lid 2 is enlarged. Thus, the welding of the frame 9 and the lid 2 can be facilitated.

The bent of the frame 9 and the end portion of the lid 2 are welded together from the outside by laser, thus facilitating the visual inspection for such a welded state, and thus making it possible to ensure the hermetic sealing characteristics.

The bent bent in the direction where the pressure is applied to the inside of the joint portion of the lid 2 to the frame 9 is provided, and thus the lid 2 comes to have the elasticity. Accordingly, the assembly when the lid 2 is welded to the frame 9 while being thrust against the heat-absorbing-side board 4 can be facilitated.

Note that the deformable structure member is a member in which a surface is deformed when the pressure is applied thereto by the thermoelectric elements, thus increasing the contact area with the thermoelectric elements. For example, besides the net-shaped members, members in a grid shape, a rough and uneven shape, a plate shape formed by embossing, and the like are applicable.

What is claimed is:

1. A manufacturing method of a thermoelectric device comprising:

joining one end surfaces of a plurality of thermoelectric elements to a wiring board;

arranging a plurality of electrode members to slidably contact other end surfaces of the plurality of thermoelectric elements;

arranging a lid outside of the electrode members; and coupling a lid and the wiring board by a coupling member so that pressure is applied between the lid and the wiring board.

2. The manufacturing method of a thermoelectric device of claim 1 further comprising:

arranging deformable structure members made of a conductive material between the thermoelectric elements and the electrode members.

3. The manufacturing method of a thermoelectric device of claim 1 further comprising:

arranging insulating members which regulate positions of the thermoelectric elements between the thermoelectric elements.

4. The manufacturing method of a thermoelectric device of claim 1, wherein a ceramic is used for the wiring board, a Kovar is used for the lid, and a ceramic is used for the coupling member, the manufacturing method further comprising:

coupling the coupling member and the wiring board by a brazing material; and coupling the coupling member and the lid by brazing material and Kovar.

5. The manufacturing method of a thermoelectric device of claim 1 further comprising:

forming a joint surface of the coupling member to the wiring board into a chamfer shape; and coupling the joint surface of the coupling member and the wiring board by a brazing material.

6. The manufacturing method of a thermoelectric device of claim 1 further comprising:

arranging the thermoelectric elements to the wiring board so that an interval between the thermoelectric elements surrounded by the electrode member is shorter than an interval between the thermoelectric element and an another thermoelectric element surrounded by an another electrode member adjacent to the electrode member.

7. The manufacturing method of a thermoelectric device of claim 1 further comprising:

making a sealing hole to the lid;

arranging the thermoelectric device in which the lid and the wiring board are coupled by the coupling member into a reduced-pressure atmosphere; and closing the sealing hole under the reduced-pressure atmosphere.

8. The manufacturing method of a thermoelectric device of claim 7, wherein the sealing hole is closed by laser.

9. The manufacturing method of a thermoelectric device of claim 1 further comprising:

forming a through hole to pass a wire to take out an electromotive power generated in the thermoelectric elements through the wiring board.

* * * * *